(12) United States Patent
Ouyang et al.

(10) Patent No.: US 6,319,799 B1
(45) Date of Patent: Nov. 20, 2001

(54) HIGH MOBILITY HETEROJUNCTION TRANSISTOR AND METHOD

(75) Inventors: Qiqing Ouyang; Al F. Tasch, Jr.; Sanjay Kumar Banerjee, all of Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/568,091

(22) Filed: May 9, 2000

(51) Int. Cl.[7] .................................................. H01L 21/425
(52) U.S. Cl. ......................... 438/528; 438/306; 438/285; 257/192
(58) Field of Search ..................... 438/199, 285, 438/797, 510, 514, 528, 530, 306; 257/192, 213, 616

(56) References Cited

U.S. PATENT DOCUMENTS

| | | | |
|---|---|---|---|
| 4,879,256 | * 11/1989 | Bean et al. | 438/797 |
| 5,155,571 | 10/1992 | Wang et al. | 357/42 |
| 5,539,214 | 7/1996 | Lynch et al. | 257/15 |
| 5,684,737 | 11/1997 | Wang et al. | 365/175 |
| 5,965,931 | 10/1999 | Wang et al. | 257/585 |
| 6,190,975 | * 2/2001 | Kubo et al. | 438/285 |

OTHER PUBLICATIONS

Wolf, S., Tauber R.N.; Silicon Processing for the VLSI Era vol. 1: Process Technology, Lattice Press, Sunset Beach, CA, 1986, pp. 397–398.*

Hareland, S.A. et al., "New structural approach for reducing punchthrough current in deep submicrometre MOSFETs and extending MOSFET scaling," *IEEE Electronics Letters*, vol 29, No. 21, pp. 1894–1896. (Oct. 14, 1993).

Hareland, Scott A. et al., "Analysis of a Heterojunction MOSFET Structure for Deep–Submicron Scaling," Proceedings of the 21st International Symposium on Compound Semiconductors, 6 pages (Sep. 1994).

Verheyen, P. et al., "A vertical $Si/Si_{1-x}Ge_x$ heterojunction pMOSFET with reduced DIBL sensitivity, using a novel gate dielectric approach," 1999 International Symposium On VLSI Technology, System and Applications, pp. 19–22 (1999).

* cited by examiner

*Primary Examiner*—John F. Niebling
*Assistant Examiner*—Christopher Lattin
(74) *Attorney, Agent, or Firm*—Townsend and Townsend and Crew LLP; Henry K. Woodward

(57) ABSTRACT

A heterojunction transistor with high mobility carriers in the channel region includes a source region and a drain region formed in a semiconductor body with the source region and the drain region comprising doped semiconductor alloys separated from the substrate by heterojunctions. A channel region is provided between the source region and the drain region comprising an undoped layer of an alloy of the semiconductor material and a deposited layer of material of the semiconductor body overlying the undoped layer. A gate electrode is formed on a gate oxide over the channel region. In fabricating the high mobility heterojunction transistor, the spaced source and drain regions are formed in the substrate by implanting dopant of conductivity type opposite to the substrate and a material in the alloy and then annealing the structure to form the alloy of the semiconductor material under the undoped layer.

30 Claims, 2 Drawing Sheets

HIGH MOBILITY HETEROJUNCTION TRANSISTOR AND METHOD

BACKGROUND OF THE INVENTION

This invention relates generally to semiconductor transistors, and more particularly the invention relates to a field effect transistor having a heterostructure quantum well as a conducting channel between a source and drain, each comprising a semiconductor alloy and having heterojunctions.

Cost effective scaling has become a major challenge in silicon MOSFET technology. Traditional techniques are starting to fail in reducing certain undesirable physical effects as device dimensions shrink down to the sub-0.1 micron regime. However, bandgap engineering can provide one more degree of freedom in device design. In order to reduce bulk punchthrough and drain-induced barrier lowering (DIBL), a type of heterojunction MOSFET (HJMOSFET) with band offset at the source/drain junctions has been proposed by Hareland, Tasch, and Mazier in "New Structural Approach For Reducing Punchthrough Current in Deep Submicrometer MOSFETs and Extending MOSFETs Scaling", *IEEE Electronics Letters*, Vol. 29, No. 21, pages 1894–1896, (October 1993), and in "Analysis of a Heterojunction MOSFET Structure For Deep Submicron Scaling", *Proceedings of the 21st International Symp. on Compound Semiconductors*, pages 18–22, (September 1994). See also Verheyen et al., "A Vertical Si/Si$_{1-x}$Ge$_x$ Heterojunction pMOSFET With Reduced DIBL Sensitivity, Using a Novel Gate Dielectric Approach", 1999 *International Symp. On VLSI Technology, System and Applications*, pages 19–22 (1999). In this structure, Bandgap Engineering is performed horizontally to tailor the potential along the channel. Compared to a silicon control device, a HJMOSFET has lower off-state leakage current and a smaller subthreshold swing. However, the drive current in a HJMOSFET is normally 50–60% lower because most of the carriers have to quantum mechanically tunnel through the potential barrier between the source and drain. See also U.S. Pat. No. 5,155,571 which discloses a MOSFET in which source and drain are formed in a silicon substrate with a GeSi channel region therebetween.

SUMMARY OF THE INVENTION

In accordance with the invention, the performance of a MOSFET is improved by incorporating a heterostructure quantum well in the conducting channel in HJMOSFETs. The band offsets between the source/drain and the channel are eliminated while the band offsets between the source/drain and the semiconductor substrate are retained. Thus, Bandgap Engineering is now performed in both the horizontal and vertical dimensions.

More particularly, the high mobility heterojunction transistor in accordance with the invention includes a semiconductor body of one conductivity type, a source region and a drain region of opposite conductivity type formed in the semiconductor body with each of the source and the drain separated from the substrate by a heterojunction. A channel region is provided between the source region and the drain region which comprises an undoped layer of an alloy of the material of the semiconductor body, and a layer of the material of the semiconductor body overlying the undoped layer. A gate electrode is provided between the source and drain regions on an insulating layer formed on the semiconductor layer.

In a preferred embodiment, the source and drain regions are formed in the semiconductor substrate by implanting dopant of the opposite conductivity type and a material in the alloy of the semiconductor material which are annealed to form an alloy of the semiconductor material under the heterostructure quantum well of the channel region. The doped layer of semiconductor material overlying the undoped alloy layer is oxidized to form a gate dielectric on which the gate electrode is formed.

The invention and objects and features thereof will be more readily apparent for the following detailed description and appended claims when taken with the drawings.

DETAILED DESCRIPTION OF ILLUSTRATIVE EMBODIMENTS

Figure 1:
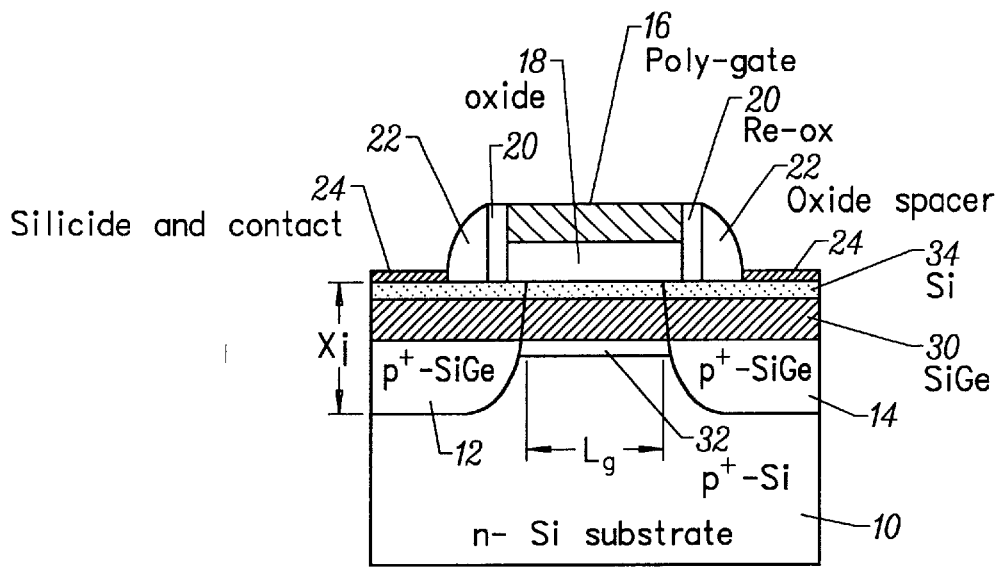
FIG. 1 is a section view illustrating a high mobility heterojunction transistor in accordance with one embodiment of the invention.

FIG. 1 is a section view illustrating a preferred embodiment of a p-channel, high mobility heterojunction transistor (PHMHJT) in accordance with the invention. In this embodiment, the transistor is fabricated in an n-doped silicon substrate 10 with spaced-apart source region 12 and drain region 14 separated by a channel region over which is formed a polysilicon gate 16 on a silicon oxide layer 18. The sides of polysilicon gate 16 adjacent to source 12 and drain 14 have oxidized layers 20 and silicon oxide spacers 22, and silicide layers and metal contacts 24 are made on the surfaces of source 12 and drain 14. The silicide can be a refractory metal silicide with the contact being aluminum, for example.

The channel region of the transistor comprises a silicon germanium alloy layer 30 with a p$^+$ silicon layer 32 under SiGe layer 30 and a cap layer 34 of silicon (doped or undoped) overlying SiGe layer 30. Unlike a traditional SiGe MODFET, the total thickness of silicon cap layer 34 and SiGe channel layer 30 is very thin, roughly on the order of the inversion layer thickness.

Each of source 12 and drain 14 comprises a p$^+$ SiGe region which forms a heterojunction with the silicon substrate 10 and suppresses bulk punchthrough and DIBL. The doped source and drain regions extend to the surface of layer 34.

Device performance is significantly enhanced in the device of FIG. 1 with a large drive current similar to a SiGe MODFET and better subthreshold characteristics similar to a SiGe HJMOSFET. This translates to higher switching speeds and transconductances, lower transit times, and lower off-gate leakage current than in a conventional silicon pMOSFET.

The use of a heterostructure quantum well channel with the SiGe layer 30 improves drive current because there are no heterojunction-induced potential barriers to tunnel through in the on-state condition for the carriers in the channel. Therefore, source injection is significantly enhanced compared to a HJMOSFET. Further, the carriers are confined in the smaller-bandgap channel where the mobility is very high. With the pHMHJT, high mobility is achieved due to strain-induced reduced hole effective mass and reduced inter-valley scattering, less surface roughness scattering in the buried channel, and less ionized impurity scattering if the channel has a modulated doping profile. Also, the absolute value of the threshold voltage is reduced due to the smaller flat-band voltage in the SiGe channel. Further, the build-in potential barriers provided by the heterojunctions in the bulk semiconductor material are not easily influenced by applied voltages. Therefore, this reduces the subthreshold swing, the shift and threshold voltage due to DIBL, and the off-date leakage current caused by bulk punchthrough and DIBL.

Figure 2A:
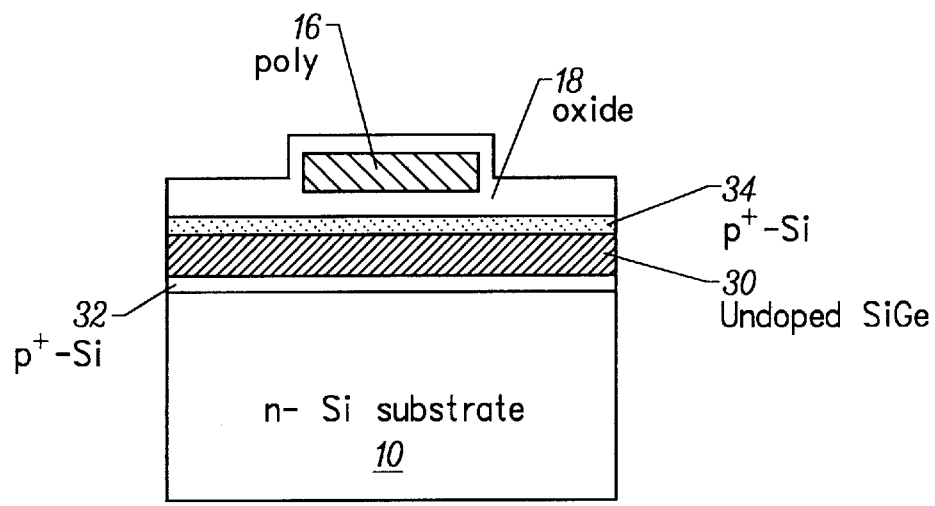
FIGS. 2a–2c are section views illustrating steps in fabricating the heterojunction transistor of FIG. 1.

Consider now FIG. 2a and the fabrication of a Si/SiGe pHMHJT with two-dimensional bandgap engineering in a planar configuration using crystal growth technique such as molecular beam epitaxy (MBE) or known chemical vapor deposition (CVD) processing. First, a thin in situ modulation doped p$^+$ silicon layer 32 is grown on the n-silicon (100) substrate 10, and then an undoped $Si_{1-x}Ge_x$ epitaxial layer 30 is grown. Carriers from p$^+$ silicon layer 32 will spill over into the undoped $Si_{1-x}Ge_x$ layer 30 and form the channel of the transistor. This is followed by the deposition of silicon layer 34 which results in another thin layer of modulation doped p$^+$ silicon or an undoped silicon layer. Layer 34 serves as a cap layer as well as a sacrificial layer for gate oxidation. Without the cap layer 34, poor interface between the strained SiGe layer 30 and the gate oxide 22 would deteriorate the device performance.

After the layers are grown, gate oxidation is performed to form oxide layer 18 followed by the polysilicon gate layer fabrication. The polysilicon gate is doped, photolithographically patterned, an etched to form gate 16, followed by sidewall 20 formation by reoxidation as shown in FIG. 2a.

Figure 2B:
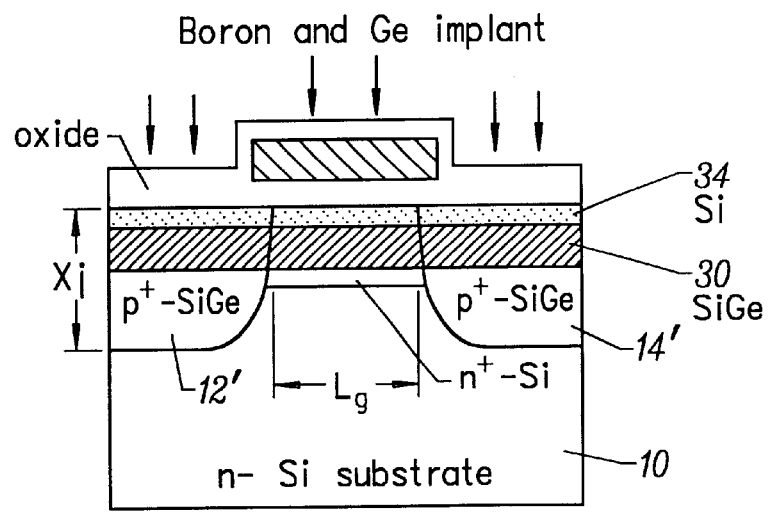

Thereafter, as shown in FIG. 2b, boron is implanted and high energy germanium is implanted followed by low temperature anneal in order to form the crystallized strained SiGe regions 12', 14' using solid phase epitaxy (SPE). The boron can be activated without undue diffusion and extends the source and drain regions to the surface of layer 34. However, the step needs to be controlled such that the p$^+$ dopant will not diffuse beyond the heterojunctions of the source and drain into the bulk silicon of the substrate. Otherwise, the benefit of the built-in band offsets will be greatly decreased. The SiGe layer 30 extends into the source and drain regions.

Figure 2C:
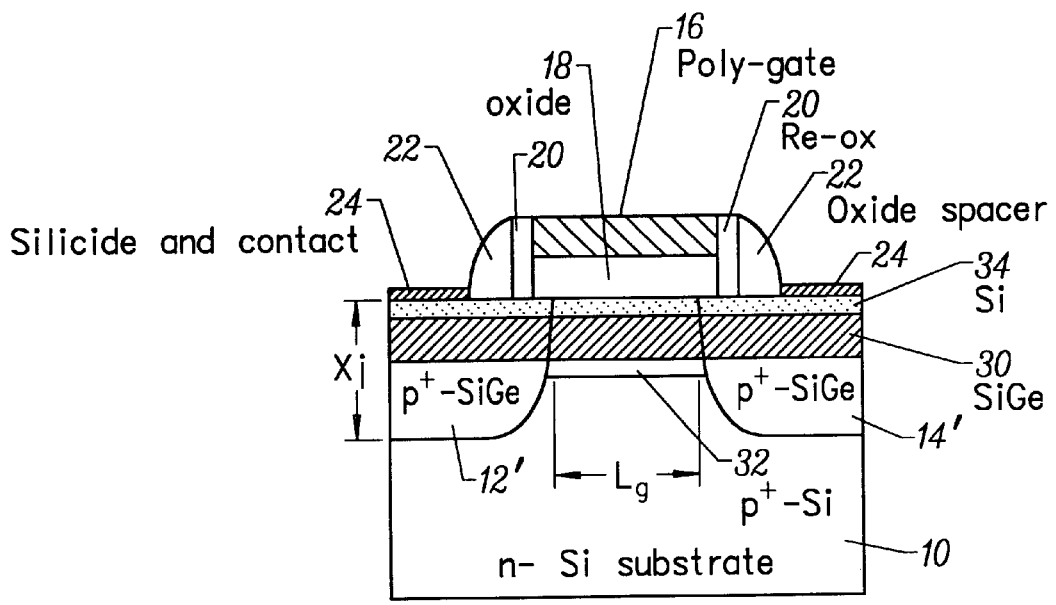

Finally, as shown in FIG. 2c, oxide spacers 22 are formed in abutment with sidewall oxide layers 20 adjacent to the source and drain, and then contacts are made to the source and drain by forming silicide layers of a refractory metal, for example, on the source and drain, and then a metal such as aluminum forming ohmic contacts 24 to the silicide layers.

A device in accordance with the invention may not need lightly doped drain (LDD) or ultrashallow source/drain extensions in a sub-0.1 micron HMHJT since hot carrier effects may not be significant due to scaled voltages, and bulk punchthrough and DIBL should be greatly suppressed by the potential barriers at the heterojunctions with the bulk silicon. This significantly simplifies the fabrication process, however such features could be included in the device structure to further enhance performance. While the invention has been described with reference to SiGe pMOSFETs, the invention can be realized in both n- and -p MOSFET with any suitable heterostructure material system. Such devices are particularly applicable in very high speed, low leakage sub-100 nm devices and microwave circuits for telecommunications applications, for example. Any problem of transient enhanced diffusion (TED) of boron in the SiGe PHMHJT can be solved by incorporating a small amount of carbon in the SiGe layer.

Thus, while the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A heterojunction transistor comprising:
    a) a silicon substrate of one conductivity type;
    b) a silicon epitaxial layer of opposite conductivity type grown on the substrate;
    c) an undoped layer of a silicon alloy formed on the epitaxial layer,
    d) a deposited layer of silicon material on the undoped layer,
    e) spaced source and drain regions formed in the silicon substrate and comprising an alloy of the silicon material and of opposite conductivity type, the source and drain regions forming a heterojunction with the silicon substrate and extending to the surface of the deposited layer, and
    f) a gate electrode between the source and drain regions on an insulating layer formed on the deposited layer.

2. The heterojunction transistor as defined by claim 1 wherein the spaced source and drain regions are formed in the substrate by implanted dopant of the opposite conductivity type and a material in the silicon alloy and then annealed to form the alloy of the silicon material.

3. The heterojunction transistor as defined by claim 2 wherein the alloy is silicon germanium.

4. The heterojunction transistor as defined by claim 3 wherein the one conductivity type is n-type and the opposite conductivity is p-type.

5. The heterojunction transistor as defined by claim 3 wherein the epitaxial layer is modulation doped.

6. The heterojunction transistor as defined by claim 5 wherein the deposited layer is undoped.

7. The heterojunction transistor as defined by claim 5 wherein the deposited layer is doped of second conductivity type.

8. The heterojunction transistor as defined by claim 7 wherein the deposited layer is modulation doped.

9. The heterojunction transistor as defined by claim 5 wherein the gate electrode has dielectric spacers on sides thereof adjacent to the source region and adjacent to the drain region, and further including contacts on the surfaces of the source region and the drain region.

10. The heterojunction transistor as defined by claim 1 wherein the alloy is silicon germanium.

11. The heterojunction transistor as defined by claim 10 wherein the one conductivity type is n-type and the opposite conductivity is p-type.

12. The heterojunction transistor as defined by claim 10 wherein the epitaxial layer is modulation doped.

13. The heterojunction transistor as defined by claim 12 wherein the deposited layer is undoped.

14. The heterojunction transistor as defined by claim 12 wherein the deposited layer is doped of second conductivity type.

15. The heterojunction transistor as defined by claim 14 wherein the deposited layer is modulation doped.

16. A method of fabricating a heterojunction transistor comprising the steps of:
    a) providing a silicon substrate of one conductivity type,
    b) growing an epitaxial layer of silicon material of opposite conductivity type on the substrate,
    c) forming an undoped layer of an alloy of the silicon material on the epitaxial layer, d) depositing a layer of silicon material on the undoped layer;

e) forming spaced source and drain regions in the silicon substrate comprising an alloy of the silicon material and of opposite conductivity type under the undoped layer, the source and drain regions forming a heterojunction with the silicon substrate and extending to the surface of the deposited layer, and f) forming a gate electrode between the source and drain regions on an insulating layer formed on the deposited layer.

17. The method as defined by claim 16 wherein the spaced source and drain regions are formed in the substrate by implanting dopant of the opposite conductivity type and a material in the silicon alloy and then annealing to form the alloy of the semiconductor material under the undoped layer.

18. The method as defined by claim 17 wherein the alloy is silicon germanium.

19. The method as defined by claim 18 wherein the epitaxial layer is modulation doped.

20. The method as defined by claim 19 wherein the deposited layer is undoped.

21. The method as defined by claim 19 wherein the deposited layer is doped of a second conductivity type.

22. The method as defined by claim 21 wherein the deposited layer is modulation doped.

23. A high mobility heterojunction transistor comprising:

a) a silicon substrate of one conductivity type;

b) a source region and a drain region comprising an alloy of the silicon material formed of opposite conductivity type in the silicon substrate with the source region and the drain region separated from the substrate by heterojunctions, c) a channel region between the source region and the drain region and comprising an undoped layer of an alloy of the material of the semiconductor body and a deposited layer of the material of the semiconductor body overlying the undoped layer, the undoped layer extending into the source region and the drain region, and d) a gate electrode between the source region and drain region on an insulating layer formed on the deposited layer.

24. The transistor as defined by claim 23 wherein the spaced source region and drain region are formed in the silicon substrate by implanting dopant of the opposite conductivity type and a material in the silicon alloy and then annealed to form the alloy of the silicon material.

25. The transistor as defined by claim 24 wherein the alloy is silicon germanium.

26. The transistor as defined by claim 25 and further including an epitaxial layer of semiconductor material of opposite conductivity type grown on the substrate under the undoped layer.

27. The transistor as defined by claim 26 wherein the epitaxial layer is modulation doped.

28. The transistor as defined by claim 27 wherein the deposited layer is undoped.

29. The transistor as defined by claim 27 wherein the deposited layer is doped of a second conductivity type.

30. The transistor as defined by claim 29 wherein the deposited layer is modulation doped.

* * * * *